(12) United States Patent
Ryu et al.

(10) Patent No.: US 8,643,002 B2
(45) Date of Patent: *Feb. 4, 2014

(54) ORGANIC LIGHT EMITTING DIODE DISPLAY

(75) Inventors: Do-Hyung Ryu, Yongin (KR); Chun-Seok Ko, Yongin (KR); Sang-Soo Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 290 days.

This patent is subject to a terminal disclaimer.

(21) Appl. No.: 13/064,795

(22) Filed: Apr. 15, 2011

(65) Prior Publication Data

US 2012/0097987 A1 Apr. 26, 2012

(30) Foreign Application Priority Data

Oct. 22, 2010 (KR) ........................ 10-2010-0103499

(51) Int. Cl.
*H01L 29/08* (2006.01)
*G09G 3/06* (2006.01)
(52) U.S. Cl.
USPC .......... 257/40; 257/88; 257/98; 257/E51.018; 313/504; 345/44
(58) Field of Classification Search
CPC ............................ G06F 1/1601; H01L 27/3276
USPC .................. 257/40, 88, 98, E51.018, E51.02; 313/504; 345/36, 39, 44, 45, 46
See application file for complete search history.

(56) References Cited

U.S. PATENT DOCUMENTS

| 6,989,571 | B2 * | 1/2006 | Park et al. ...................... 257/350 |
| 7,990,061 | B2 * | 8/2011 | Kim ............................... 313/512 |
| 8,258,523 | B2 * | 9/2012 | Lee et al. ........................ 257/91 |
| 2005/0139821 | A1 * | 6/2005 | Park ............................... 257/40 |
| 2007/0177069 | A1 * | 8/2007 | Lee ................................ 349/56 |
| 2008/0239637 | A1 * | 10/2008 | Sung et al. ..................... 361/681 |
| 2012/0026074 | A1 * | 2/2012 | Lee et al. ........................ 345/76 |
| 2012/0104420 | A1 * | 5/2012 | Lee et al. ........................ 257/88 |

FOREIGN PATENT DOCUMENTS

| JP | 05-205876 | 8/1993 |
| JP | 2001-052858 | 2/2001 |
| JP | 2007-220569 | 8/2007 |
| KR | 10-2006-0089977 A | 8/2006 |
| KR | 10-2006-0112207 A | 10/2006 |
| KR | 10-2007-0083124 A | 8/2007 |

* cited by examiner

*Primary Examiner* — Kenneth Parker
*Assistant Examiner* — Jose R Diaz
(74) *Attorney, Agent, or Firm* — Lee & Morse, P.C.

(57) ABSTRACT

An organic light emitting diode display includes a substrate, a display unit that includes a common power line and a common electrode, an encapsulation substrate that is attached to the substrate by an adhering layer enclosing the display unit and includes a resin matrix and a plurality of carbon fiber. The display includes a first conductive portion and a second conductive portion. The first conductive portion is on a first inner surface region, a first side surface region, and a first outer surface region of the encapsulation substrate. The first conductive portion is adapted to supply a first electrical signal to the common power line. The second conductive portion is on a second inner surface region, a second side surface region, and a second outer surface region of the encapsulation substrate. The second conductive portion is adapted to supply a second electrical signal to the common electrode.

23 Claims, 14 Drawing Sheets

ORGANIC LIGHT EMITTING DIODE DISPLAY

BACKGROUND

1. Field

Embodiments relate to an organic light emitting diode (OLED) display and an encapsulation substrate for sealing a display unit.

2. Description of the Related Art

An organic light emitting diode (OLED) display is a self-light-emitting display that may include with an organic light emitting diode capable of emitting its own light to display an image. The function of the display unit including a plurality of organic light emitting elements may be deteriorated by, e.g., penetration of external moisture and oxygen. As such, a technology for sealing the display unit to suppress the penetration of external moisture and oxygen may be very important.

The above information disclosed in this Background section is only for enhancement of understanding of the background of the described technology. Therefore, this Background may contain information that does not form the prior art that is already known in this country to a person of ordinary skill in the art.

SUMMARY

Embodiments are directed to an organic light emitting diode display with an increased sealing function of a display unit.

Embodiments may be realized by providing an organic light emitting diode display according to an exemplary embodiment that includes a substrate and a display unit on the substrate, and the display unit includes a common power line and a common electrode. The display includes an encapsulation substrate attached to the substrate by an adhering layer enclosing the display unit, and the encapsulation substrate includes a resin matrix and a plurality of carbon fibers. The display includes a first conductive portion on a first inner surface region, a first side surface region, and a first outer surface region of the encapsulation substrate, and the first conductive portion is adapted to supply a first electrical signal to the common power line. The display includes a second conductive portion on a second inner surface region, a second side surface region, and a second outer surface region of the encapsulation substrate, and the second conductive portion is adapted to supply a second electrical signal to the common electrode.

The plurality of carbon fibers may be intersected inside the resin matrix. The encapsulation substrate may be formed of a plurality of layers, and each of the plurality of layers may include a resin matrix and a plurality of carbon fibers. A first carbon fiber of a first plurality of carbon fibers positioned in at least one layer of the plurality of layers may cross a second carbon fiber of a second plurality of carbon fibers positioned in at least another layer of the plurality of layers.

The organic light emitting diode display may further include an insulating layer formed on an inner surface, a side surface, and an outer surface of the encapsulation substrate. The first conductive portion and the second conductive portion may be positioned at the insulating layer.

The second conductive portion may include a second inner layer facing the display unit and contacting the adhering layer, and the first conductive portion may include a first inner layer positioned at the edge of the encapsulation substrate and separated from the second inner layer. The first inner layer and the second inner layer may include at least one of an aluminum layer, an aluminum alloy layer, a copper layer, and a copper alloy layer.

The first conductive portion may further include a first outer layer connected to the first inner layer, and the first outer layer may have at least one of a greater width or thickness than the first inner layer. The second conductive portion may include a second outer layer connected to the second inner layer, and the second outer layer may have at least one of a greater width or thickness than the second inner layer.

The first conductive portion and the second conductive portion may be made of a metal foil and may be attached on the insulating layer.

The first conductive portion and the second conductive portion may include inner layers positioned at the inner surface of the encapsulation substrate, outer layers positioned at the outer surface of the encapsulation substrate, connection layers positioned at the side surface of the encapsulation substrate, and connection portions overlapping the inner layers and the outer layers.

Embodiments may also be realized by providing an organic light emitting diode display according to another exemplary embodiment includes a substrate and a display unit on the substrate, and the display unit includes a first common power line, a second common power line, and a common electrode. The display further includes a first pad portion positioned outside the display unit, and the first pad portion is connected to the first common power line and the second common power line. The display further includes an encapsulation substrate attached to the substrate by an adhering layer enclosing the display unit, and the encapsulation substrate includes a resin matrix and a plurality of carbon fibers. The display further includes a first conductive portion on a first inner surface region, a first side surface region, and a first outer surface region of the encapsulation substrate, and the first conductive portion is connected to the first pad portion by the conductive adhering layer and being adapted to supply a first electrical signal to the first common power line and the second common power line. The display further includes a second conductive portion on a second inner surface region, a second side surface region, and a second outer surface region of the encapsulation substrate, and the second conductive portion is adapted to supply a second electrical signal to the common electrode.

The organic light emitting diode display may include a second pad portion positioned outside the display unit and connected to the common electrode, and the first pad portion and the second pad portion are alternately and repeatedly positioned according to one direction of the substrate.

The adhering layer may be conductive in a thickness direction and may be insulating in other directions except for the thickness direction, and the adhering layer may overlap the first pad portion and the second pad portion.

The conductive adhering layer may include a first conductive adhering layer positioned between the first pad portion and the first conductive portion, and a second conductive adhering layer separated from the first conductive adhering layer and positioned between the second pad portion and the second conductive portion.

The first conductive portion may include a first inner layer positioned at the first inner surface region of the encapsulation substrate, a first connection layer positioned at the first side surface region of the encapsulation substrate, and a first outer layer positioned at the first outer surface region of the encapsulation substrate. The second conductive portion may include second inner layer positioned at the second inner surface region of the encapsulation substrate, a second connection layer positioned at the second side surface region of the encapsulation substrate, and a second outer layer positioned at the second outer surface region of the encapsulation substrate.

The second inner layer may be formed with a larger area than the display unit, and forms a plurality of extension portions overlapping the second pad portion and the conductive adhering layer. The first inner layer may be positioned between the extension portions, and overlaps the first pad portion and the conductive adhering layer.

The first outer layer may be on at least three edges of the encapsulation substrate, and the second outer layer may be on the remaining edge of the encapsulation substrate.

The common electrode may include a plurality of protruding portions, and the second conductive portion may be close to the plurality of protruding portions. The second conductive portion may include a second inner layer positioned at the second inner surface region of the encapsulation substrate and close to the protruding portion, a second connection layer positioned at the second side surface region of the encapsulation substrate, and a second outer layer positioned at the second outer surface region of the encapsulation substrate.

The second inner layer may be formed with a larger area than the display unit, and may include one of an aluminum layer, an aluminum alloy layer, a copper layer, and a copper alloy layer.

The organic light emitting diode display may further include a plurality of spacers positioned under the common electrode, and the protruding portion may be provided corresponding to a plurality of spacers.

The organic light emitting diode display may further include an insulating layer formed at an inner surface, a side surface, and an outer surface of the encapsulation substrate, and the first conductive portion and the second conductive portion may be positioned on the insulating layer.

The organic light emitting diode display may increase a sealing function of the display unit and the luminance uniformity while realizing a large-sized display unit, and may also simplify the entire structure and the manufacturing process by a reduction of the number of parts.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
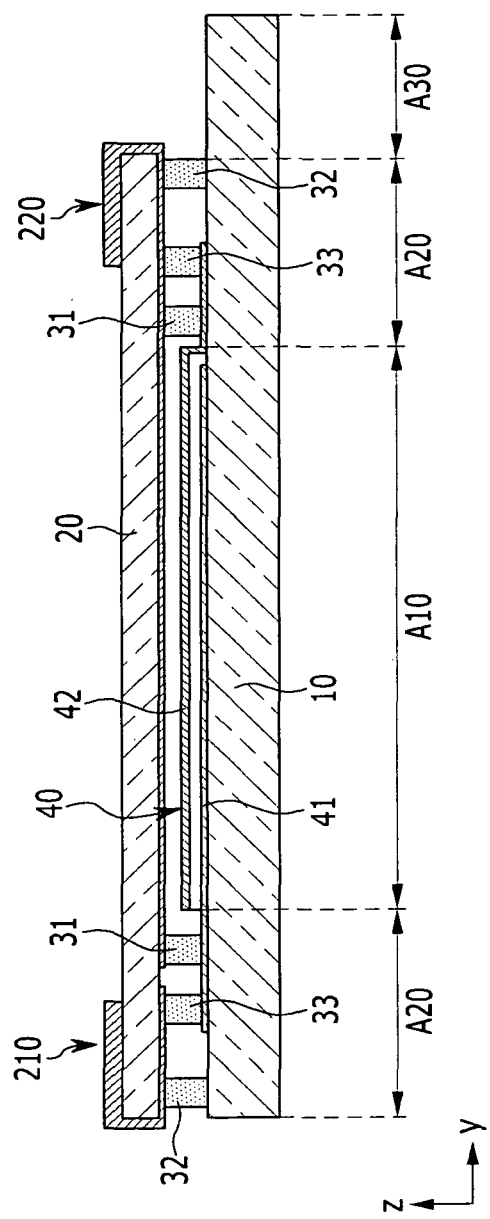
FIG. 1 illustrates a cross-sectional view of an organic light emitting diode display according to an exemplary embodiment.

Korean Patent Application No. 10-2010-0103499, filed on Oct. 22, 2010, in the Korean Intellectual Property Office, and entitled: "Organic Light Emitting Diode Display" is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification. The size and thickness of each component shown in the drawings are arbitrarily shown for understanding and ease of description, but the embodiments are not limited thereto.

Through the specification, it will be understood that when an element such as a layer, film, region, or substrate is referred to as being "on" another element, it can be directly on the other element or intervening elements may also be present. In the specification and the claims that follow, when it is described that an element is "connected" to another element, the element may be "directly connected" to the other element or "electrically connected" to the other element through a third element.

FIG. 1 illustrates a schematic cross-sectional view of an organic light emitting diode display according to a first exemplary embodiment.

Referring to FIG. 1, a display 100, e.g., an organic light emitting diode (OLED) display, according to the first exemplary embodiment may include a substrate 10, a display unit 40 formed on the substrate 10, and an encapsulation substrate 20 fixed to the substrate 10 by at least adhering layers 31 and 32 enclosing the display unit 40. The substrate 10 may include a display area A10 where the display unit 40 is located and a non-display area outside of the display area A10. For example, the non-display area may be divided into a wire and sealing area A20 and a pad area A30.

The display unit 40 may include an organic light emitting element and a driving circuit formed in each pixel. The organic light emitting element may include a pixel electrode, an organic emission layer, and/or a common electrode 42. The driving circuit may be formed of at least two thin film transistors, e.g., including a switching thin film transistor and a driving thin film transistor, and/or at least one capacitor.

Gate lines, data lines, and/or common power lines 41 may be arranged in each pixel. The gate line may transmit a scan signal and the data line may transmit a data signal. The common power line 41 may apply a common voltage to the driving thin film transistor. The common power line 41 may be parallel with the data line. The common power line 41 may include a first common power line that is parallel with the data line and a second common power line that is parallel with the gate line.

A detailed description of the display unit 40 will be given later, and FIG. 1 schematically illustrates the display unit 40 where the common power line 41 and the common electrode 42 are formed.

The adhering layers 31 and 32 may include a first adhering layer 31 surrounding the display unit 40 and a second adhering layer 32 located at the outside of the first adhering layer 31. For example, the second adhering layer 32 may surround both the display unit 40 and the first adhering layer 31. A conductive adhering layer 33 may be disposed between the first adhering layer 31 and the second adhering layer 32. The first adhering layer 31 and the second adhering layer 32 may not include a conductive material. For example, the first and second adhering layers 31 and 32 may include a thermal hardening resin, such as an epoxy resin. A moisture absorbing filler (not shown) may be formed between the substrate 10 and the encapsulation substrate 20. For example, the moisture absorbing filler may be formed at an inner side of the first adhering layer 31.

In the display 100 of the first exemplary embodiment, the common power line 41 and the common electrode 42 may not connected with a flexible printed circuit attached to the pad area A30. The common power line 41 may be connected with a first conductive portion 210 formed in the encapsulation substrate 20 and may receive a first electric signal therefrom. The common electrode 42 may be connected with a second conductive portion 220 formed in the encapsulation substrate 20 and may receive a second electric signal therefrom.

Without intending to be bound by this theory, the display 100 of the first exemplary embodiment may apply evenly the corresponding electric signal to the common power line 41 and the common electrode 42 without forming the pad areas A30 at four edges, e.g., up, down, right, and left, of the substrate 10. As a result, the entire structure and the manufacturing process of the OLED display 100 may be simplified while reducing and/or preventing luminance non-uniformity in large-sized display manufacturing.

Figure 2:
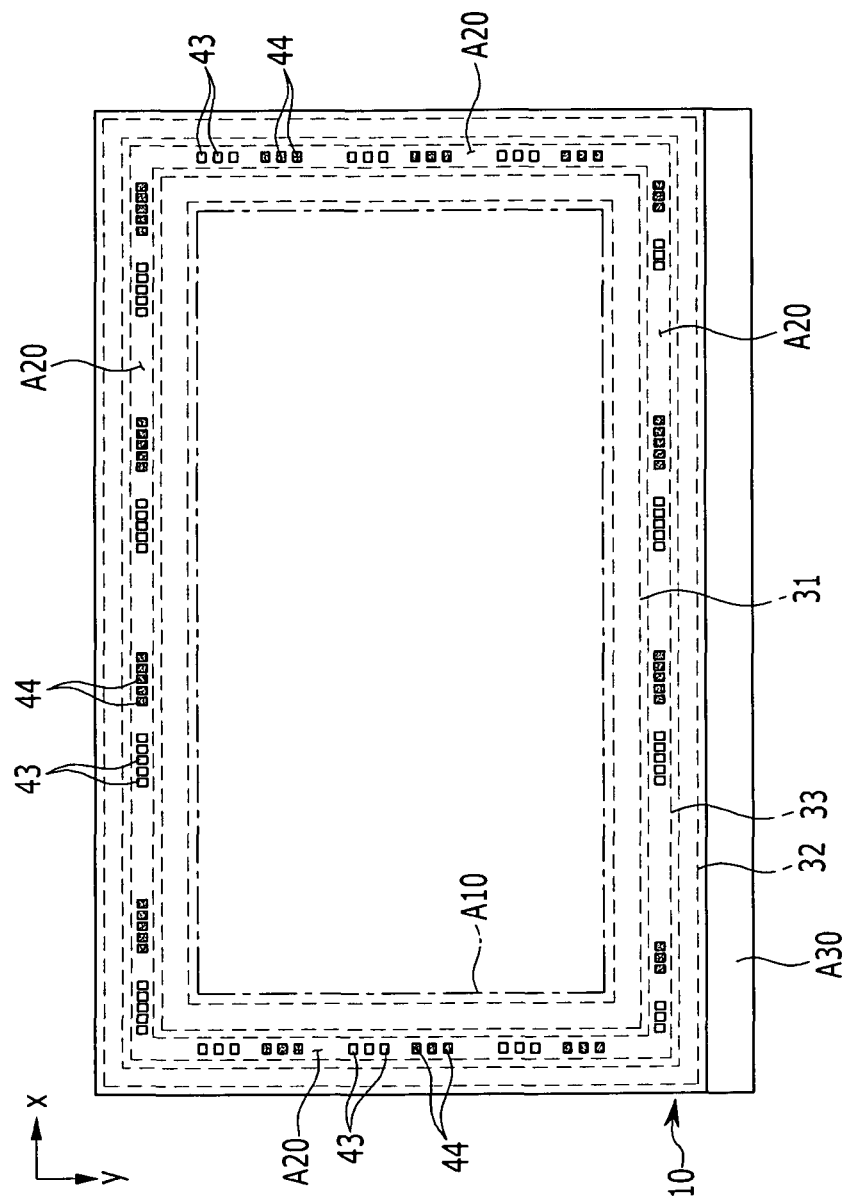
FIG. 2 illustrates a top plan view of a substrate of the organic light emitting diode display of FIG. 1.

FIG. 2 shows a top plan view of a substrate of the display of FIG. 1.

Referring to FIG. 1 and FIG. 2, a substrate 10 may have a rectangular shape with a pair of long edges and a pair of short edges. The wire and sealing areas A20 may be located at the outside of the four edges of the display area A10. The first adhering layer 31, the conductive adhering layer 33, and/or the second adhering layer 32 may be located in the wire and sealing area A20 of the substrate 10.

The pad area A30 may be located at one of the edges of the substrate 10. The pad area A30 may be located at the external side of the wire and sealing area A20. FIG. 2 illustrates that the pad area A30 as located at the lower long side of the substrate 10. However, the location of the pad area A30 is not limited thereto. For example, the pad area A30 may be located on a short side of the substrate 10.

A first pad portion 43 may be connected with the common power line 41 of the display unit 40. A second pad portion 44 may be connected with the common electrode 42 of the display unit 40. The first and second pad portions 43 and 44 may be located in the wire and sealing area A20. The first pad portion 43 and the second pad portion 44 may be formed in a plurality, e.g., four, of the wire and sealing areas A20 of the substrate 10. Each first and second pad portion 43 and 44 may include a plurality of pads, e.g., four pads. The first and second pad portions 43 and 44 may be iteratively alternated along a horizontal direction (x-axis direction in the drawing) and a vertical direction (y-axis direction in the drawing) of the substrate 10. For example, as shown in FIG. 2, in the vertical direction the substrate may have an alternating arrangement of first and second pad portions 43 and 44, and each of the first and second pad portions 43 and 44 may include a plurality of pads. In the horizontal direction, the substrate may have an alternating arrangement of first and second pad portions 43 and 44, and each of the first and second pad portions 43 and 44 may include a plurality of pads. In at least the horizontal direction, the number of pads in the first and second pad portions 43 and 44 may vary based on, e.g., a distance from a center of the substrate.

FIG. 2 illustrates the second pad portion 44 with a dot pattern in order to distinguish between the first pad portion 43 and the second pad portion 44. Among a plurality of first pad portions 43, a first pad portion 43 located at the long side of the substrate 10 may be electrically connected with the first common power line. A first pad portion 43 located at the short side of the substrate 10 may be electrically connected with the second common power line. However, FIG. 2 exemplarily shows the locations and the number of first and second pads 43 and 44, but they are not restrictive.

The first pad portion 43 and the second pad portion 44 may be formed at the positions corresponding to the conductive adhering layer 33 among the wire and sealing area A20. According to an exemplary embodiment, the conductive adhering layer 33 may be conductive in only the thickness direction (z-axis direction in FIG. 1) and not other directions. Without intending to be bound by this theory, the first pad portion 43 and the second pad portion 44 may not short-circuited even though one conductive adhering layer 33 contacts both of the first pad portion 43 and the second pad portion 44.

The conductive adhering layer 33 may not separately formed for the first pad portion 43 and the second pad portion 44, and may be formed of a single member. In this case, the assembly process of the substrate 10 and the encapsulation substrate 20 may be simplified by using the first and second adhering layers 31 and 32 and the conductive adhering layer 33. Thus, the manufacturing of the display 100 may be simplified.

Figure 3:
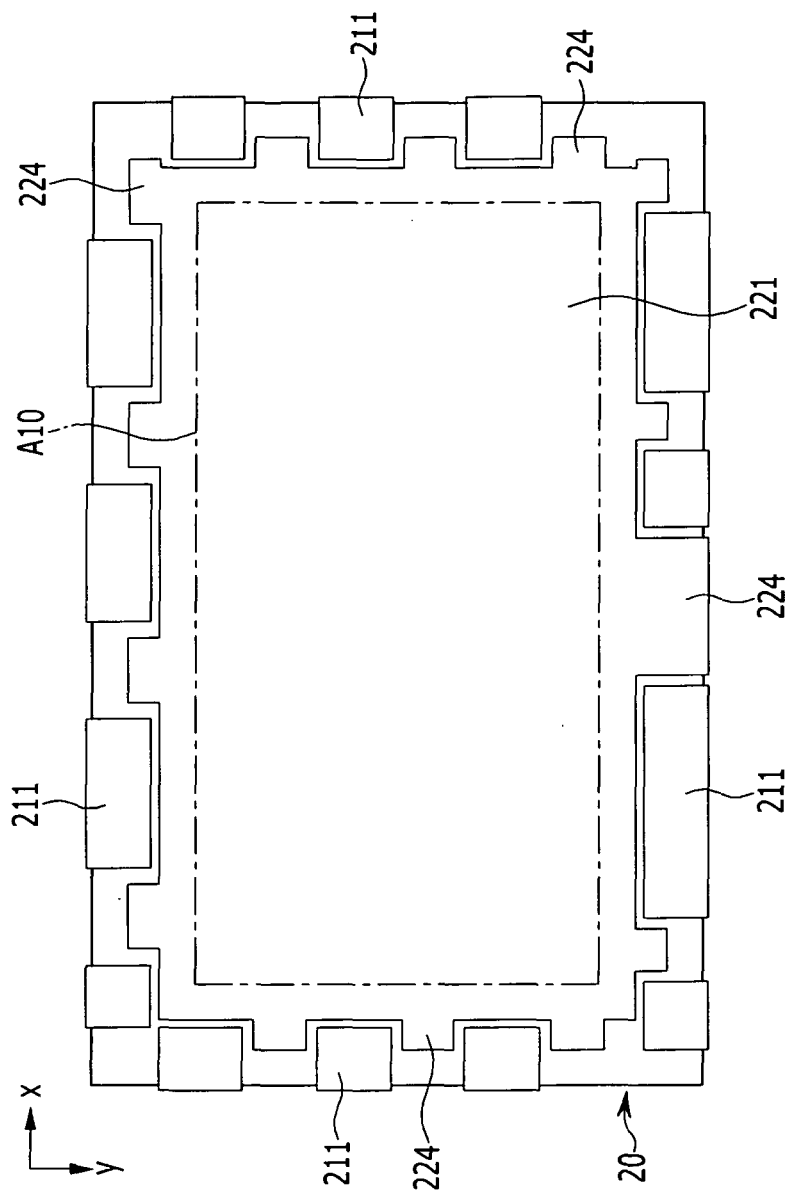
FIG. 3 illustrates a top plan view of an inner surface of an encapsulation substrate of the organic light emitting diode display of FIG. 1.
Figure 4:
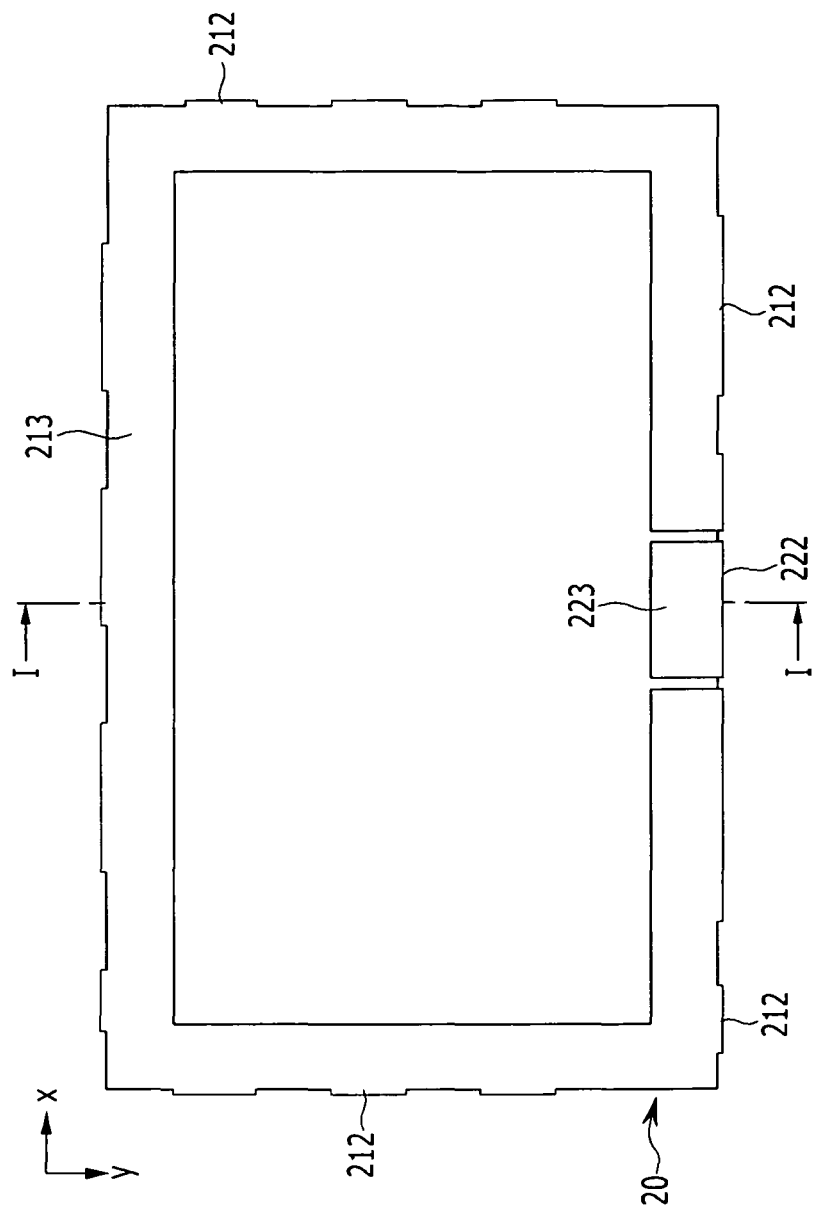
FIG. 4 illustrates a top plan view of an outer surface of an encapsulation substrate of the organic light emitting diode display of FIG. 1.
Figure 5:
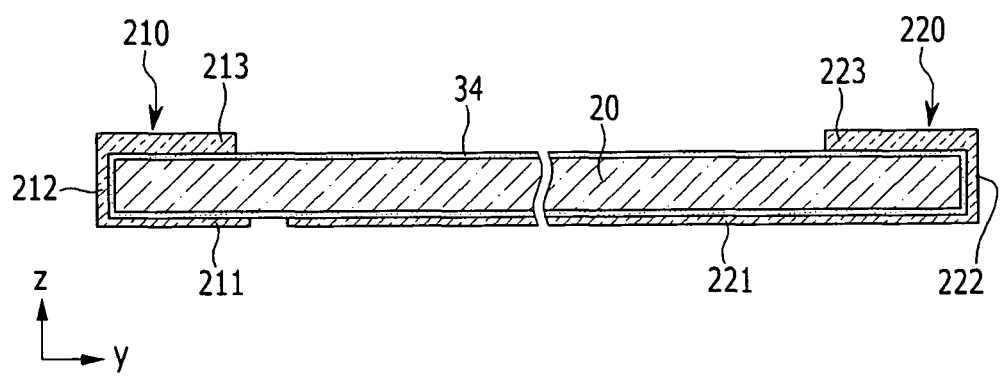
FIG. 5 illustrates a cross-sectional view taken along the line I-I of FIG. 4.

FIG. 3 illustrates a top plan view of an inner surface of an encapsulation substrate of display shown in FIG. 1. FIG. 4 illustrates a top plan view of an outer surface of an encapsulation substrate of the display shown in FIG. 1. FIG. 5 illustrates a cross-sectional view taken along the line I-I of FIG. 4.

Referring to FIG. 1 to FIG. 5, the encapsulation substrate 20 may be formed with a size that covers the display area A10 and the wire and sealing areas A20 of the substrate 10. For example, the encapsulation substrate 20 may cover all the wire and sealing areas A20 formed along the four sides of the substrate 10. Thus, the pad area A30 of the substrate 10 may exposed to the outside without being overlapped with the encapsulation substrate 20.

The encapsulation substrate 20 may include an inner surface facing toward the substrate 10, an outer surface opposite the inner surface, and a side surface connecting the inner surface and the outer surface. The first conductive portion 210 configured to apply the first electric signal of the common power line 41 may be formed on the inner surface, the side surface, and the outer surface of the encapsulation substrate 20. For example, the first conductive portion 210 may be formed on specific regions of the inner surface, the side surface, and the outer surface of the encapsulation substrate 20. The second conductive portion 220 configured to apply the second electric signal of the common electrode 42 may be formed on the inner surface, the side surface, and the outer surface of the encapsulation substrate 20 at an interval from the first conductive portion 210. For example, the second conductive portion 220 may be formed on specific regions of the inner surface, the side surface, and the other surface of the encapsulation substrate. The first conductive portion 210 and the second conductive portion 220 may be spaced apart on the encapsulation substrate 20, e.g., spaced apart along a same side surface of the encapsulation substrate 20 and/or spaced apart along different side surfaces of the encapsulation substrate 20.

The first conductive portion 210 may include a first inner layer 211 positioned at the inner surface of the encapsulation substrate 20, a first connection layer 212 contacting the first inner layer 211 and positioned at the side surface of the encapsulation substrate 20, and a first outer layer 213 contacting the first connection layer 212 and positioned at the outer surface of the encapsulation substrate 20.

The second conductive portion 220 may include a second inner layer 221 positioned at the inner surface of the encapsulation substrate 20, a second connection layer 222 contacting the second inner layer 221 and positioned at the side surface of the encapsulation substrate 20, and a second outer layer 223 contacting the second connection layer 222 and positioned at the outer surface of the encapsulation substrate 20. The entire first conductive portion 210 and the entire second conductive portion 220 may be formed with a conducting material.

The second inner layer 221 may cover the entire display unit 40. The second inner layer 221 may be equal to or larger than the first adhering layer 31. The second inner layer 221 may be formed with a smaller size than the conductive adhering layer 33. The second inner layer 221 may include a plurality of extension portions 224 facing the second pad portion 44 of the substrate 10. The extension portion 224 may contact the conductive adhering layer 33. Accordingly, the second pad portion 44 of the substrate 10 may be electrically connected to the second inner layer 221 through the conductive adhering layer 33 and the extension portion 224.

Among a plurality of extension portions 224, at least one extension portion 224 may extend into the edge of the encapsulation substrate 20 to contact, e.g., the second connection layer 222 formed at the side surface of encapsulation substrate 20. FIG. 3 shows the case that one extension portion 224 positioned at the long edge of the encapsulation substrate 20 among the plurality of extension portions 224 is extended into the edge of the encapsulation substrate 20 to contact the second connection layer 222.

Also, FIG. 3 shows the case that one extension portion 224 has a bar shape covering several second pad portions 44. However, the shape of the extension portion 224 is not limited thereto. For example, the second inner layer 221 may be divided into several extension portions 224 corresponding to the second pad portion 44.

The second inner layer 221 may be formed with, e.g., a metal layer. The metal layer may have an excellent function for reducing and/or preventing moisture and oxygen penetration as well as low resistivity. The second inner layer 221 may include at least one of an aluminum layer, an aluminum alloy layer, a copper layer, or a copper alloy layer. The second inner layer 221 may be close to the first adhering layer 31, thereby completely covering the display unit 40 inside the first adhering layer 31. The second inner layer 221 may reduce and/or prevent the penetration of the moisture and oxygen from the outside. Without intending to be bound by this theory, the second inner layer 221 may function as a metal encapsulation layer sealing the display unit 40.

The first inner layer 211 may be formed to face the first pad portion 43 of the substrate 10 between the extension portions 224 of the second inner layer 221. The first inner layer 211 may contact the conductive adhering layer 33. The first inner layer 211 may be formed in plural, and the plurality of first inner layers 211 may all extend into the edge of the encapsulation substrate 20, thereby contacting the first connection layer 212 formed at the side surface of the encapsulation substrate 20. Accordingly, the first pad portion 43 of the substrate 10 may be electrically connected to the first inner layer 211 throughout the conductive adhering layer 33.

The first outer layer 213 and the second outer layer 223 may be formed at the edge of the encapsulation substrate 20 while having an interval therebetween. The first outer layer 213 may overlap all of the plurality of first inner layers 211. The second outer layer 223 may overlap a portion of the second inner layer 221 and at least one extension portion 224.

For example, as shown in FIG. 4, the second outer layer 223 may be formed at the portion of the edge of one long edge of the encapsulation substrate 20, and the first outer layer 213 may be formed at the entire remaining edge of the encapsulation substrate 20. However, the shape of the first outer layer 213 and the second outer layer 223 is not limited thereto and may be variously modified.

The first outer layer 213 and the second outer layer 223 may be attached to an external access terminal (not shown). Thus, the first outer layer 213 may receive a first electric signal of the first common power line 41 from the external access terminal and transmit the signal to the first inner layer 211. The second outer layer 223 may receive a second electric signal of the common electrode 42 from the external access terminal and transmit the signal to the second inner layer 221.

The first conductive portion 210 and the second conductive portion 220 may have a constant thickness, or one may have a greater thickness than the other layer. The first outer layer 213 and the second outer layer 223 may be formed with a greater thickness than the first inner layer 211 and the second inner layer 221. Also, the first outer layer 213 may have a small width margin, differently from the first inner layer 211, such that it is may be formed with a larger width than the first inner layer 211.

To minimize and/or prevent the occurrence of stepped portions during the sealing process of the substrate 10 and the encapsulation substrate 20, the first inner layer 111 and the second inner layer 121 may have the same thickness and the first outer layer 113 and the second outer layer 123 may have same thickness. The above-described structure may be usefully applied to a large-sized OLED display having a large current capacity without, e.g., extension of the outer size of the display unit 40.

The first inner layer 211 forming the first conductive portion 210 may be integrally formed with the first connection layer 212 and the first outer layer 213. The second inner layer 221 forming the second conductive portion 220 may be integrally formed with the second connection layer 222 and the second outer layer 223.

The first conductive portion 210 and the second conductive portion 220 may be formed by, e.g., providing a metal foil having good flexibility, such as aluminum foil or copper foil, and attaching the metal foil to the inner surface, the side surface, and the outer surface of the encapsulation substrate 20. According to other exemplary embodiments, the first and second conductive portions 210 and 220 may be formed by depositing or printing conducting material on the inner surface, the outer surface, and the side surface of the encapsulation substrate 20.

The encapsulation substrate 20 may be formed of, e.g., a carbon composite material including a resin matrix and a plurality of carbon fibers. Without intending to be bound by this theory, a glass or a polymer resin having a low thermal expansion coefficient may be used for the substrate 10 of the display 100 because the substrate 10 may need to undergo several heat treatments for forming the driving circuit and the organic light emitting element thereon. The encapsulation substrate 20 may have a thermal expansion coefficient that is similar to that of the substrate 10 by controlling the content of the carbon fiber and the content of the resin matrix. Thus, if the substrate 10 and the encapsulation substrate 20 are sealed to each other by, e.g., hardening the first adhering layer 31 at a high temperature, torsion of the two substrates 10 and 20 due to a thermal expansion coefficient difference therebetween may not occur, and a bending problem may not occur in an environment reliability test after sealing.

The encapsulation substrate 20 formed of the carbon composite material may have conductivity. Without intending to be bound by this theory, when the first and second conductive portions 210 and 220 are directly formed on the surface of the encapsulation substrate 20, the first conductive portion 210 and the second conductive portion 220 are short-circuited through the encapsulation substrate 20. Thus, as shown in FIG. 5, insulating films 34 may be formed at the inner and outer surfaces of the encapsulation substrate 20, and the first conductive portion 210 and the second conductive portion 220 may be formed on the insulating films 34 to prevent a short-circuit between the first conductive portion 210 and the second conductive portion 220. A detailed structure and constituents of the encapsulation substrate 20 will be described later.

Figure 6:
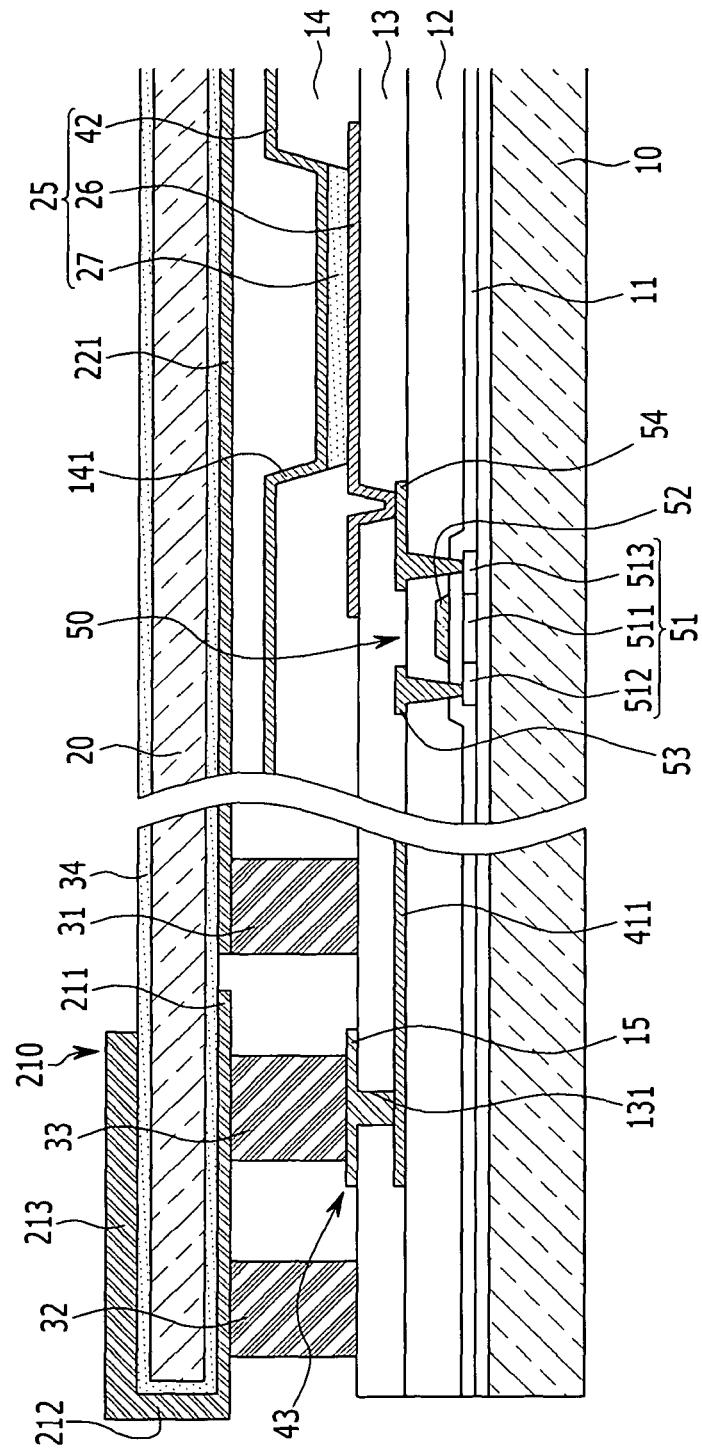
FIG. 6 to FIG. 8 illustrate partial enlarged cross-sectional views of the organic light emitting diode display according to exemplary embodiments.
Figure 7:
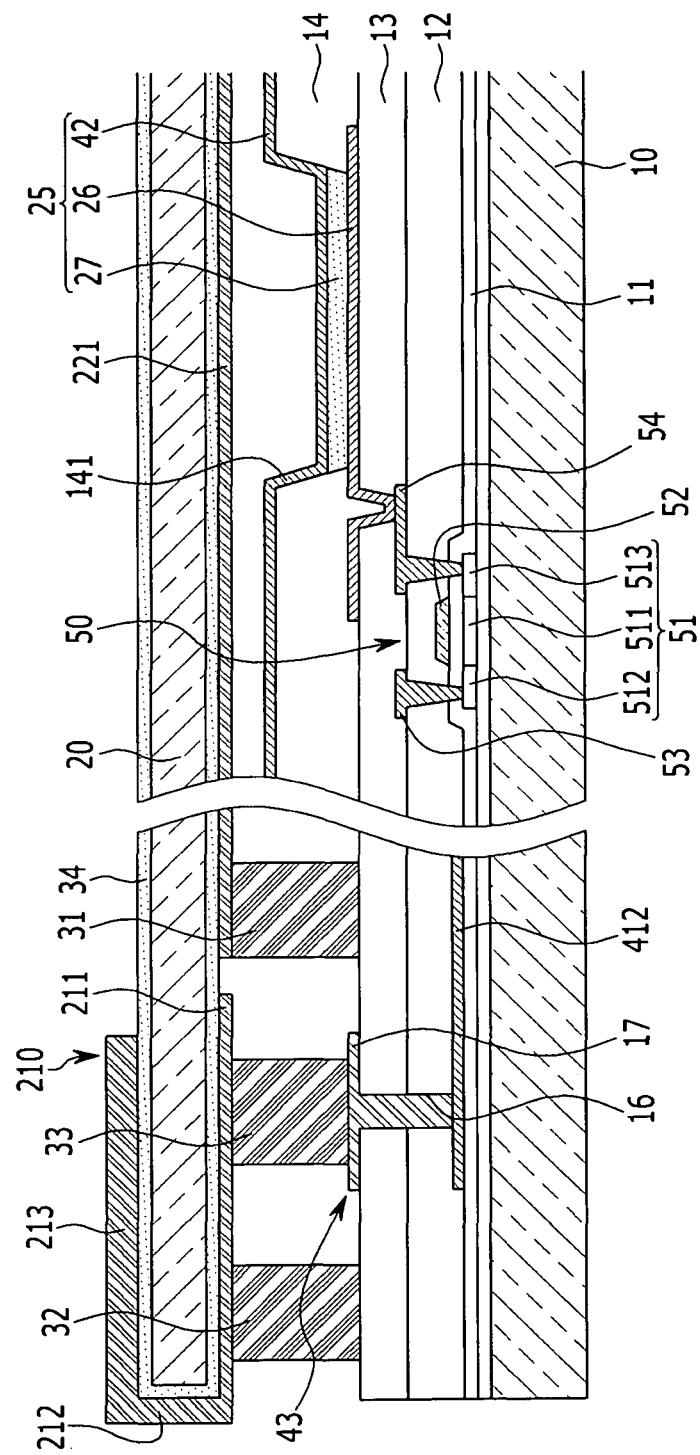
Figure 8:
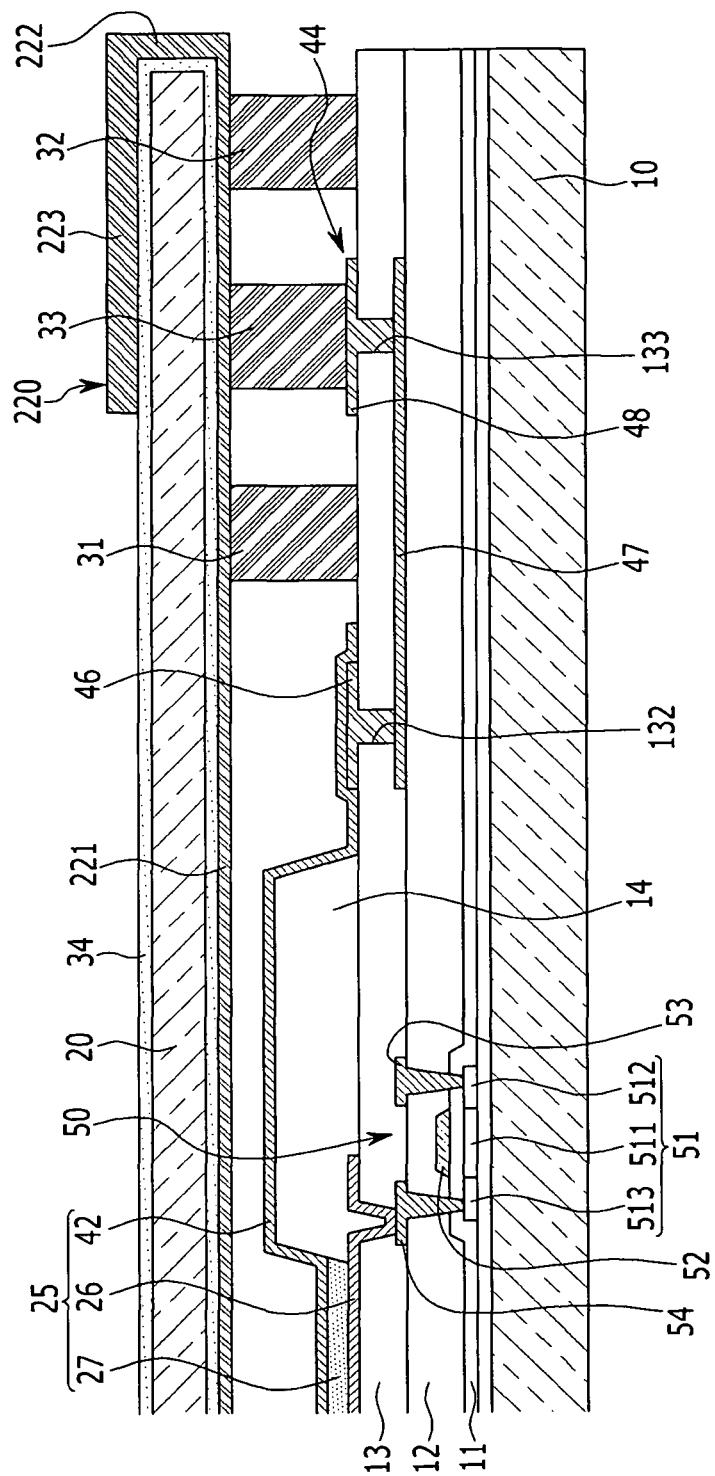

FIG. 6 to FIG. 8 illustrate partial enlarged cross-sectional views of the display according to the first exemplary embodiment. FIG. 6 shows a first common power line and a first pad portion in detail. FIG. 7 shows a second common power line and a first pad portion in detail. FIG. 8 shows a common electrode and a second pad portion in detail.

Referring to FIG. 6 to FIG. 8, the above-described display area A10 may include an organic light emitting element 25 and a driving circuit per each pixel. The driving circuit may include at least two thin film transistors and at least one capacitor. FIG. 6 to FIG. 8 simply illustrate an exemplary one thin film transistor 50 and an exemplary one organic light emitting element 25, which are positioned at the display area A10.

The thin film transistor 50 may include a semiconductor layer 51, a gate electrode 52, a source electrode 53, and a drain electrode 54. The semiconductor layer 51 may be formed as a polycrystalline silicon film. The semiconductor layer 51 may include a channel area 511, a source area 512, and a drain area 513. The channel area 511 may be an intrinsic semiconductor not doped with an impurity, and the source area 512 and the drain area 513 may be impurity-doped impurity semiconductors.

The gate electrode 52 may be disposed on the channel area 511 of the semiconductor layer 51. A gate insulating layer 11 may be interposed between the gate electrode 52 and the channel area 511. The source electrode 53 and the drain electrode 54 may be disposed on the gate electrode 52. An interlayer insulating layer 12 may be interposed between the gate electrode 52 and each of the source electrode 53 and the drain electrode 54. The source electrode 53 and the drain electrode 54 may be connected with the respective source area 512 and the drain area 513 through a contact hole formed in at least one of the interlayer insulating layer 12 and the gate insulating layer 11. A planarization layer 13 may be formed on the source electrode 53 and the drain electrode 54. A pixel electrode 26 may be formed on the planarization layer 13. The pixel electrode 26 may be connected with the drain electrode 54 through a contact hole in the planarization layer 13.

A pixel definition layer 14 may be formed on the pixel electrode 26 and the planarization layer 13. The pixel definition layer 14 may partially expose the pixel electrode 26 by forming an opening 141 in each pixel. An organic emission layer 27 may be formed on the exposed pixel electrode 26. The common electrode 42 may be formed in the entire area of the display unit 40 to cover the organic emission layer 27 and the pixel definition layer 14. The organic light emitting element 25 may include the pixel electrode 26, the organic emission layer 27, and the common electrode 42.

According to an exemplary embodiment, the pixel electrode 26 may be a hole injection electrode, and the common electrode 42 may be an electron injection electrode. In this embodiment, the organic emission layer 27 may include a hole injection layer (HIL), a hole transport layer (HTL), an emission layer, an electron transport layer (ETL), and an electron injection layer (EIL) that are sequentially stacked on the pixel electrode 26. Holes and electrons may be injected to the organic emission layer 27 from the pixel electrode 26 and the common electrode 42, and emission of light from the organic emission layer 27 may occur when, e.g., excitons being combinations of the injected holes and electrons drop from an excited state to a ground state.

The pixel electrode 26 may be formed as a transflective conductive layer. The common electrode 42 may be formed as a reflective conductive layer. Light emitted from the organic emission layer 27 may be reflected by the common electrode 42 and then emitted to the outside through the substrate 10. Such a light emission structure is called a rear light emission type. The pixel electrode 26 may include, e.g., a triple-layered film of ITO/silver (Ag)/ITO. The common electrode 42 may include, e.g., at least one of silver (Ag), aluminum (Al), a silver alloy, and an aluminum alloy.

A first common power line 411 and a second common power line 412 may be formed on the same layer of one of the gate electrode 52, the source electrode 53, and the drain electrode 54. As shown in FIG. 6, the first common power line 411 may be formed on the same layer of the source and drain electrodes 53 and 54. The common power line 411 may be formed with the same material as the source and drain electrodes 53 and 54. As shown in FIG. 7, the second common power line 412 may be formed on the same layer of the gate electrode 52. The second common power line 412 may be formed with the same material as the gate electrode 52.

Referring to FIG. 6 and FIG. 7, end portions of the first common power line 411 and the second common power line 412 may be extended to the wire and sealing area A20 outside the display unit 40. In addition, at least one insulating layer, e.g., among four insulating layers formed in the display unit 40, may be extended to the wire and sealing area A20. The end portion of the first common power line 411 may be covered by the planarization layer 13. The end portion of the second common power line 412 may be covered by the interlayer insulating layer 12 and the planarization layer 13.

The planarization layer 13 may include a second opening 131 that exposes the end portion of the first common power line 411. A first pad conductive layer 15 may be formed on the planarization layer 13 and may be electrically connected with the first common power line 411 through the second opening 131. The first pad portion 43 disposed in the long side of the substrate 10 may be defined as the first pad conductive layer 15.

The interlayer insulating layer 12 and planarization layer 13 may include a third opening 16 that exposes an end portion of the second common power line 412. A second pad conductive layer 17 may be formed on the planarization layer 13 and may be electrically connected with the second common power line 412 through the third opening 16. The first pad portion 43 may be disposed at the short side of the substrate 10 and may be defined as the second pad conductive layer 17.

The first pad conductive layer 15 and second pad conductive layer 17 may be formed on the same layer of the pixel electrode 26. The first and second conductive layers 15 and 17 may include the same material as the pixel electrode 26. Then, an additional patterning process for forming the first and second pad conductive layers 15 and 17 may be omitted; thereby the manufacturing process can be simplified.

Referring to FIG. 8, the common electrode 42 may be disposed at an inner side of the first adhering layer 31. The second pad portion 44 may be disposed crossing around the inner and outer sides of the first adhering layer 31 such that the common electrode 42 and the conductive adhering layer 33 are conductively connected to each other.

The second pad portion 44 may include a third pad conductive layer 46, a fourth pad conductive layer 47, and a fifth pad conductive layer 48. The third pad conductive layer 46 may be disposed at the inner side of the first adhering layer 31, and may contact, e.g., directly contact, the common electrode 42. The fourth pad conductive layer 47 may be connected to the third pad conductive layer 46 through a fourth opening 132 of the planarization layer 13, and may be disposed crossing along the inner and outer sides of the first adhering layer 31. The fifth pad conductive layer 48 may be disposed between the conductive adhering layer 33 and the planarization layer 13, and may be connected with the fourth pad conductive layer 47 through a fifth opening 133 in the planarization layer 13.

The third pad conductive layer 46 and the fifth pad conductive layer 48 may be formed on the same layer as the pixel electrode 26. The third and fifth pad conductive layers 46 and 48 may be formed of the same material as the pixel electrode 26. The fourth pad conductive layer 47 may be formed on the same layer of one of the gate electrode 52 and the source and drain electrodes 53 and 54. The fourth pad conductive layer 47 may be formed of the same material as one of the gate electrode 52 and the source and drain electrodes 53 and 54. Thus, an additional patterning process for forming the second pad portion 44 may be omitted; thereby the manufacturing process can be simplified.

FIG. 8 exemplarily illustrates that the fourth pad conductive layer 47 is formed on the same layer of the source and drain electrodes 53 and 54. The detailed structure of the second pad 44 is not limited to the illustrated example. For example, any structure in which the common electrode 42 of the display area A10 and the conductive adhering layer 33 of the wire and sealing area A20 are conductive to each other may be applicable.

Without intending to be bound by this theory, the display 100 of the first exemplary embodiment can evenly apply the corresponding electric signals to the common power line 41 and the common electrode 42, e.g., in four (up, down, right, and left) directions of the display area A10, without forming the pad areas A30 at four edges of the substrate 10 while realizing a large-sized display unit 40. As a result, the entire structure and the manufacturing process of the display 100 of the first exemplary embodiment may be simplified and the luminance uniformity may be improved while realizing a large-sized display unit 40 while reducing the number of parts.

In the previously-stated display 100, the substrate 10 may be made of, e.g., transparent glass or transparent plastic. The substrate 10 made of a transparent plastic material may include, e.g., at least one of polyether sulfone, polyacrylate, polyether imide, polyethylene naphthalate, polyethylene terephthalate, polyphenylene sulfide, polyarylate, polyimide, polycarbonate, cellulose triacetate, and cellulose acetate propionate.

A plurality of processes for forming a plurality of pixels on the substrate 10 may be performed. Heat may be applied to the substrate 10 during the processes, such that the substrate 10 may expand by the heat. Without intending to be bound by this theory, expansion of the substrate 10 may reduce durability of the display 100, e.g., an OLED display, and reduce the density of the display unit 40. Therefore, a material having a low thermal expansion coefficient may be selected for the substrate 10. The substrate 10 may be made of glass or plastic having a thermal expansion coefficient approximately between $3 \times 10-6/K$ to $4 \times 10-6/K$.

Figure 9:
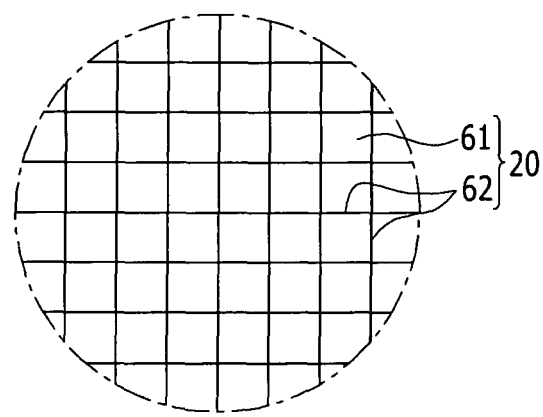
FIG. 9 illustrates a partial enlarged top plan view of an encapsulation substrate of the organic light emitting diode display of FIG. 1.

FIG. 9 illustrates a partial enlarged top plan view of an encapsulation substrate of the display shown in FIG. 1.

Referring to FIG. 9, according to an exemplary embodiment, the encapsulation substrate 20 may be made of a carbon composite material including a resin matrix 61 and a plurality of carbon fibers 62. The encapsulation substrate 20 may have a structure in which the plurality of carbon fibers 62 are saturated in the resin matrix 61.

The carbon fiber 62 may have a lower thermal expansion coefficient than the substrate 10. Particularly, the thermal expansion coefficient in the length direction of the carbon fiber 62 may be a negative (−) value. The resin matrix 61 may have a higher thermal expansion coefficient than the substrate 10. Thus, the thermal expansion coefficient of the encapsulation substrate 20 may be controlled by controlling the amount of carbon fibers 62 and the amount of the resin matrix 61. For example, when manufacturing the encapsulation substrate 20 by compounding the carbon fibers 62 and the resin matrix 61, the thermal expansion coefficient of the encapsulation substrate 20 may be controlled to be equivalent or similar to that of the substrate 10 by controlling the ratio of the resin matrix 61 and the carbon fibers 62.

Without intending to be bound by this theory, the carbon fibers 62 may not absorb moisture so they increase the waterproof ability of the encapsulation substrate 20. The encapsulation substrate 20 including the carbon fibers 62 may have excellent mechanical properties so that high mechanical strength can be realized with a small thickness. Thus, the entire thickness of the 100 can be reduced. The encapsulation substrate 20 may function to suppress the thermal expansion of the first inner layer 211 and the second inner layer 221.

The plurality of carbon fibers 62 in the encapsulation substrate 20 may be arranged to cross each other. For example, the plurality of carbon fibers 62 may be woven with wefts and warps. Although FIG. 9 shows when the carbon fibers 62 perpendicularly cross each other, the embodiments are not limited to the example shown in FIG. 9. For example, the carbon fibers 26 may cross each other at predetermined angles other than a right angle. According to the configuration described above, the encapsulation substrate 20 may have a low thermal expansion coefficient throughout the region and the durability of the encapsulation substrate 20 may be increased.

Figure 10:
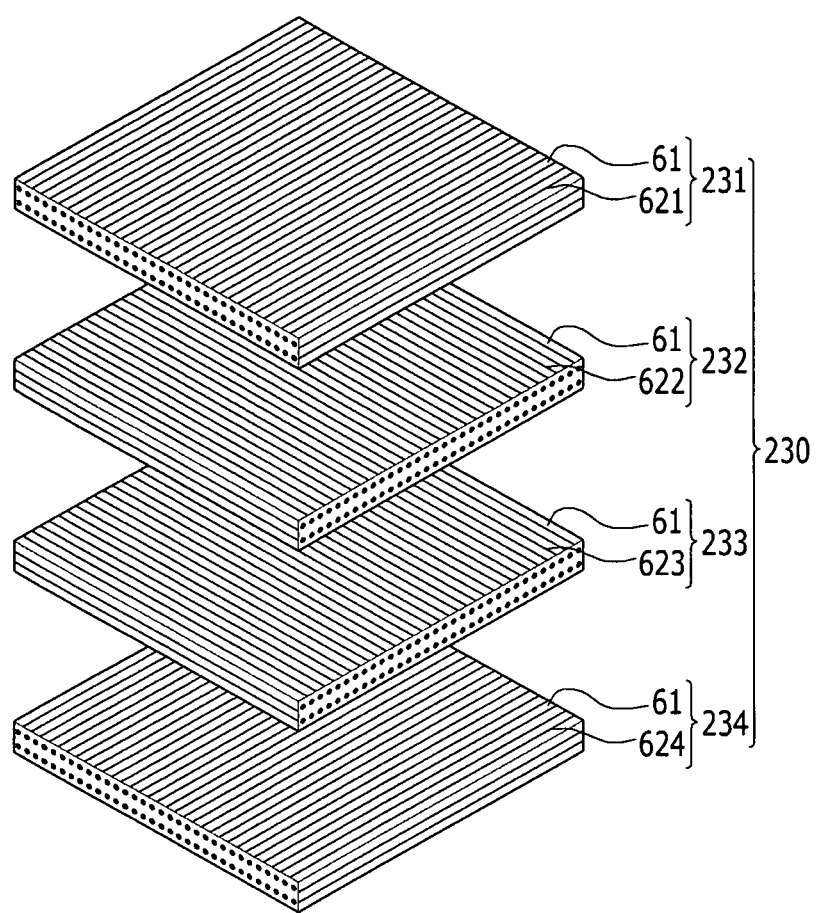
FIG. 10 illustrates an exploded perspective view of an encapsulation substrate of the organic light emitting diode display of FIG. 1 as an exemplary variation of FIG. 9.

FIG. 10 illustrates an exploded perspective view of an encapsulation substrate of the display shown in FIG. 1 as an exemplary variation of FIG. 9.

Referring to FIG. 10, an encapsulation substrate 230 may be formed of a plurality of layers. For example, the encapsulation substrate 230 may have a structure formed by stacking a first layer 231, a second layer 232, a third layer 233, and a fourth layer 234. Each of the layers 231, 232, 233, and 234 may include a plurality of carbon fibers 621, 622, 623, and 624, respectively, and a resin matrix 61.

The carbon fibers 621 and 624 of the first layer 231 and the fourth layer 234, respectively, may be arranged along a first direction. The carbon fibers 622 and 623 of the second and third layers 232 and 233, respectively, may be arranged along a second direction. The first direction and the second direction may or may not perpendicularly cross each other. FIG. 10 exemplarily illustrates that the first direction and the second direction perpendicularly cross each other. Without intending to be bound by this theory, when the plurality of carbon fibers 621, 622, 623, and 624 have the above-described arrangement, torsion of the encapsulation substrate 230 may be suppressed such that the planarity of the encapsulation substrate 230 may be increased.

In order to control the thermal expansion coefficient of the encapsulation substrate 230, an angle formed by an arrangement direction of the carbon fibers 621 and 624 in the first and fourth layers 231 and 234, respectively, and an arrangement direction of the carbon fibers 622 and 623 of in the second and third layers 232 and 233, respectively, may be variously set. The thermal expansion coefficient of each of the respective layers 231, 232, 233, and 234 can be easily controlled by controlling the amount of the resin matrix 61 and the amount of the corresponding carbon fibers 621, 622, 623, and 624.

Figure 11:
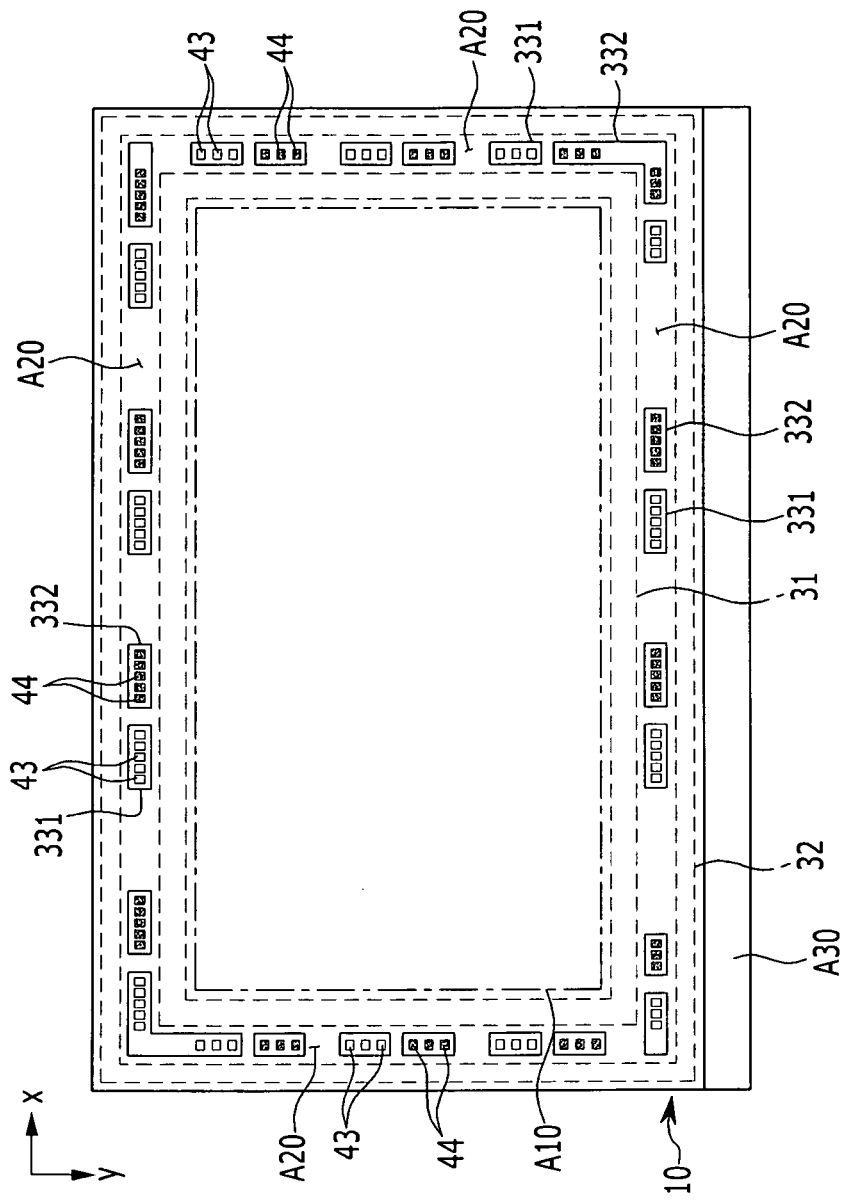
FIG. 11 illustrates a top plan view of a substrate of an organic light emitting diode display according to an exemplary embodiment.

FIG. 11 illustrates a top plan view of a substrate of a display, e.g., an organic light emitting diode (OLED) display, according to the second exemplary embodiment.

Referring to FIG. 11, a display 200 of the second exemplary embodiment may be similar to the display of the first exemplary embodiment except that at least a first conductive adhering layer 331 corresponding to the first pad portion 43 and a second conductive adhering layer 332 corresponding to the second pad portion 44 may be separately positioned. Like reference numerals designate like elements to those of the first exemplary embodiment.

The first conductive adhering layer 331 and the second conductive adhering layer 332 may have conductivity in all directions. Accordingly, the first conductive adhering layer 331 and the second conductive adhering layer 332 may have a distance therebetween to prevent a short-circuit therebetween. For example, the first and second conductive adhering layers 331 and 332 may be spaced apart.

The first conductive adhering layer 331 may be positioned between the first pad portion 43 and the first inner layer 211 (referring FIG. 3), such that the first pad portion 43 and the first inner layer 211 may be electrically connected to each other. The second conductive adhering layer 332 may be positioned between the second pad portion 44 and the extension portion 224 (referring to FIG. 3) of the second inner layer 221 such that the second pad portion 44 and the second inner layer 221 may be electrically connected to each other.

Figure 12:
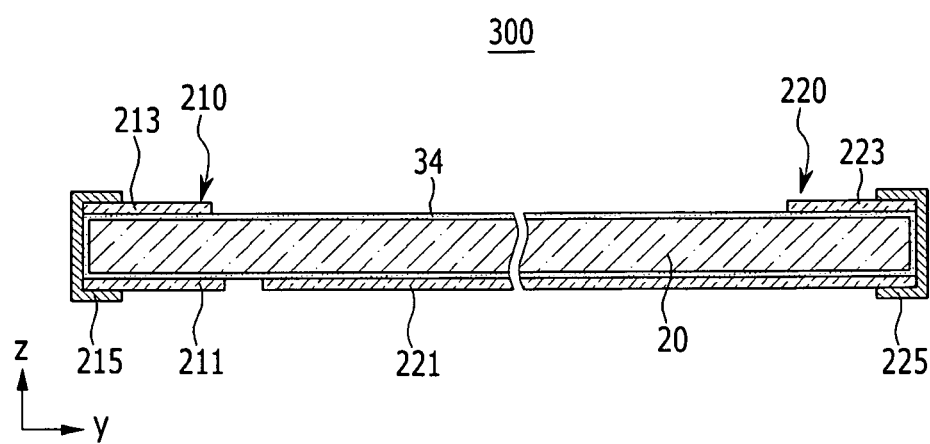
FIG. 12 illustrates a cross-sectional view of an encapsulation substrate of an organic light emitting diode display according to an exemplary embodiment.

FIG. 12 illustrates a cross-sectional view of an encapsulation substrate of a display, e.g., of an organic light emitting diode (OLED) display, according to the third exemplary embodiment.

Referring to FIG. 12, a display 300 of the third exemplary embodiment is similar to the display of the first exemplary embodiment or the second exemplary embodiment except for at least the first conductive portion 210 and the second conductive portion 220 that have overlapping connection layers. Like reference numerals designate like elements of the first exemplary embodiment.

The first inner layer 211 and the second inner layer 221 may be formed on the inner surface of the encapsulation substrate 20, and the first outer layer 213 and the second outer layer 223 may be formed on the outer surface of the encapsulation substrate 20. A first connection layer 215 may be formed on the side surface of the encapsulation substrate 20, on overlapping portions of the first inner layer 211 and the first outer layer 213. A second connection layer 225 may be formed on the side surface of the encapsulation substrate 20 while overlapping portions of the second inner layer 221 and the second outer layer 223.

In this case, the first connection layer 215 may be made of a conducting material different from the first inner layer 211 and the first outer layer 213. The first connection layer 215 may be formed at or attached to the encapsulation substrate 20 through a different method from the first inner layer 211 and the second outer layer 223. The second connection layer 225 may be made of a conducting material different from the second inner layer 221 and the second outer layer 223. The second connection layer 225 may be formed at or attached to the encapsulation substrate 20 through a different method from the second inner layer 221 and the second outer layer 223.

Figure 13:
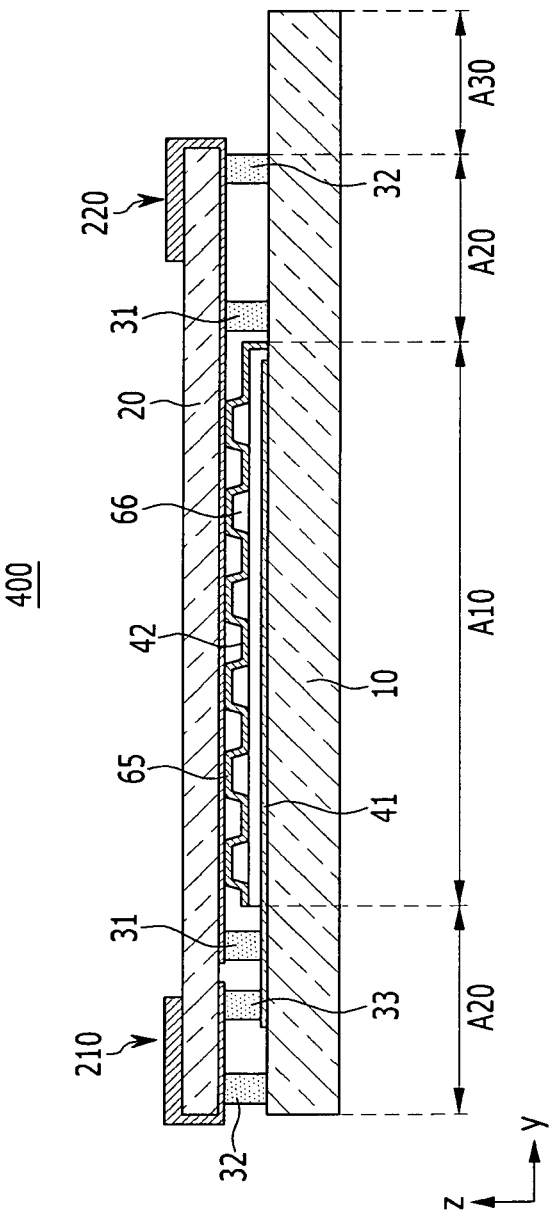
FIG. 13 illustrates a cross-sectional view of an organic light emitting diode display according to an exemplary embodiment.
Figure 14:
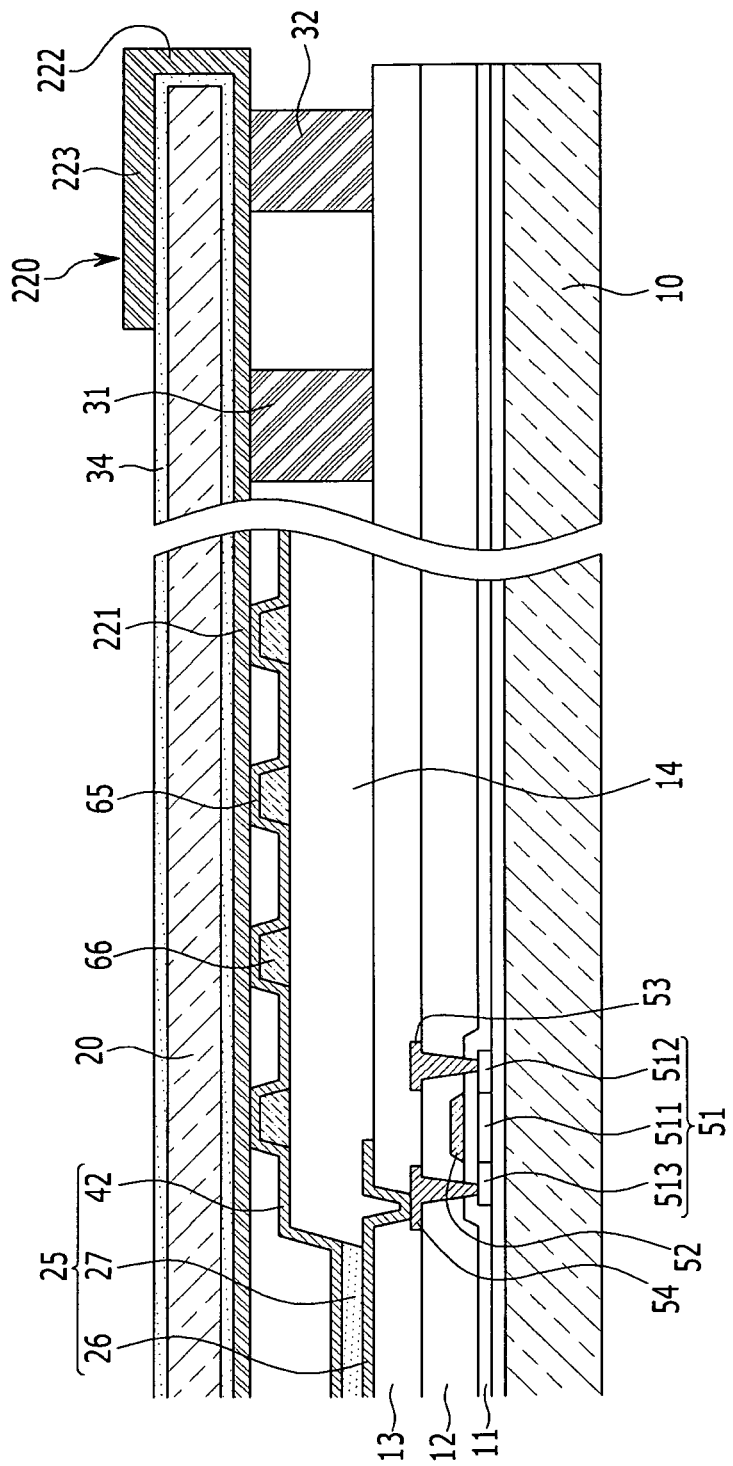
FIG. 14 illustrates a partial enlarged view of the organic light emitting diode display of FIG. 13.

FIG. 13 illustrates a cross-sectional view of a display, e.g., an organic light emitting diode (OLED) display, according to the fourth exemplary embodiment. FIG. 14 illustrates a partial enlarged view of the display shown in FIG. 13.

Referring to FIG. 13 and FIG. 14, a display 400, e.g., an organic light emitting diode (OLED) display, of the fourth exemplary embodiment is similar to the display of one exemplary embodiment among the first exemplary embodiment to the third exemplary embodiment, except for at least the second pad portion that is omitted and the second inner layer 221 of the encapsulation substrate 20 that contacts the common electrode 42. Like reference numerals designate like elements to those of the first exemplary embodiment.

In the display area A10, the common electrode 42 may form a protrusion and depression structure, e.g., a plurality of protruding portions 65. The protruding portions 65 may be close to the second inner layer 221 formed at the encapsulation substrate 20. Accordingly, the common electrode 42 may be directly connected to the second conductive portion 220. Therefore, the common electrode 42 may receive the second electric signal without passing through the conductive adhering layer.

The protrusion and depression structure of the common electrode 42 may be realized by, e.g., spacers 66. For example, a plurality of spacers 66 may be formed on a pixel definition layer 14, and the common electrode 42 may be formed on the entire display area A10 while covering the plurality of spacers 66. The common electrode 42 may be sealed to the second inner layer 221 when sealing the substrate 10 and the encapsulation substrate 20 by pressing. Accordingly, the common electrode 42 may be electrically connected with the second conductive portion 220.

In the display 400 of the fourth exemplary embodiment, only a first pad portion may be disposed in a wire and sealing area A20 for applying a first electric signal of a common power line 41. In addition, the second inner layer 221 formed in the encapsulation substrate 20 may not include the extension portion only extended toward the second pad portion without contacting the second connection layer among the plurality of extension portions described in the first exemplary embodiment.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims. It will also be understood that the invention is not limited to the disclosed embodiments, but, on the contrary, is intended to cover various modifications and equivalent arrangements included within the spirit and scope of the appended claims.

What is claimed is:

1. An organic light emitting diode display, comprising:
   a substrate;
   a display unit on the substrate, the display unit including a common power line and a common electrode;
   an encapsulation substrate attached to the substrate by an adhering layer enclosing the display unit, the encapsulation substrate including a resin matrix and a plurality of carbon fibers;
   a first conductive portion on a first inner surface region, a first side surface region, and a first outer surface region of the encapsulation substrate, the first conductive portion being adapted to supply a first electrical signal to the common power line; and
   a second conductive portion on a second inner surface region, a second side surface region, and a second outer surface region of the encapsulation substrate, the second conductive portion being adapted to supply a second electrical signal to the common electrode.

2. The organic light emitting diode display of claim 1, wherein the plurality of carbon fibers are intersected inside the resin matrix.

3. The organic light emitting diode display of claim 1, wherein
   the encapsulation substrate includes a plurality of layers, and each of the plurality of layers includes a resin matrix and a plurality of carbon fibers, and
   a first carbon fiber of a first plurality of carbon fibers positioned in at least one layer of the plurality of layers crosses a second carbon fiber of a second plurality of carbon fibers positioned in at least another layer of the plurality of layers.

4. The organic light emitting diode display of claim 1, further comprising an insulating layer on an inner surface, a side surface, and an outer surface of the encapsulation substrate, the first conductive portion and the second conductive portion being positioned on the insulating layer.

5. The organic light emitting diode display of claim 4, wherein:
   the second conductive portion includes a second inner layer facing the display unit and contacting the adhering layer, and
   the first conductive portion includes a first inner layer positioned at the edge of the encapsulation substrate and separated from the second inner layer.

6. The organic light emitting diode display of claim 5, wherein the first inner layer and the second inner layer include at least one of an aluminum layer, an aluminum alloy layer, a copper layer, and a copper alloy layer.

7. The organic light emitting diode display of claim 5, wherein:
   the first conductive portion includes a first outer layer connected to the first inner layer, and
   the first outer layer has at least one of a greater width or greater thickness than the first inner layer.

8. The organic light emitting diode display of claim 5, wherein:
   the second conductive portion includes a second outer layer connected to the second inner layer, and
   the second outer layer has at least one of a greater width or greater thickness than the second inner layer.

9. The organic light emitting diode display of claim 4, wherein the first conductive portion and the second conductive portion are made of a metal foil and are attached to the insulating layer.

10. The organic light emitting diode display of claim 4, wherein the first conductive portion and the second conductive portion include inner layers positioned at the inner surface of the encapsulation substrate, outer layers positioned at the outer surface of the encapsulation substrate, connection layers positioned at the side surface of the encapsulation substrate, and overlapping portions that overlap the inner layers and the outer layers.

11. An organic light emitting diode display comprising:
    a substrate;
    a display unit on the substrate, the display unit including a first common power line, a second common power line, and a common electrode;
    a first pad portion positioned outside the display unit, the first pad portion being connected to the first common power line and the second common power line;
    an encapsulation substrate attached to the substrate by an adhering layer enclosing the display unit, the encapsulation substrate including a resin matrix and a plurality of carbon fibers;
    a first conductive portion on a first inner surface region, a first side surface region, and a first outer surface region of the encapsulation substrate, the first conductive portion being connected to the first pad portion by the conductive adhering layer and being adapted to supply a first electrical signal to the first common power line and the second common power line; and
    a second conductive portion on a second inner surface region, a second side surface region, and a second outer surface region of the encapsulation substrate, the second conductive portion being adapted to supply a second electrical signal to the common electrode.

12. The organic light emitting diode display of claim 11, further comprising a second pad portion positioned outside the display unit and connected to the common electrode, the first pad portion and the second pad portion being alternately and repeatedly positioned according to one direction of the substrate.

13. The organic light emitting diode display of claim 12, wherein the adhering layer is conductive in a thickness direction and insulating in other directions except for the thickness direction, and the adhering layer overlaps the first pad portion and the second pad portion.

14. The organic light emitting diode display of claim 12, wherein the adhering layer includes a first conductive adhering layer positioned between the first pad portion and the first conductive portion, and a second conductive adhering layer separated from the first conductive adhering layer and positioned between the second pad portion and the second conductive portion.

15. The organic light emitting diode display of claim 12, wherein:

the first conductive portion includes a first inner layer positioned at the first inner surface region of the encapsulation substrate, a first connection layer positioned at the first side surface region of the encapsulation substrate, and a first outer layer positioned at the first outer surface region of the encapsulation substrate, and the second conductive portion includes a second inner layer positioned at the second inner surface region of the encapsulation substrate, a second connection layer positioned at the second side surface region of the encapsulation substrate, and a second outer layer positioned at the second outer surface region of the encapsulation substrate.

16. The organic light emitting diode display of claim 15, wherein the second inner layer has a larger area than the display unit, and includes a plurality of extension portions overlapping the second pad portion and the conductive adhering layer.

17. The organic light emitting diode display of claim 16, wherein the first inner layer is positioned between the extension portions and overlaps the first pad portion and the conductive adhering layer.

18. The organic light emitting diode display of claim 15, wherein:
the first outer layer is on at least three edges of the encapsulation substrate, and
the second outer layer is on the remaining edge of the encapsulation substrate.

19. The organic light emitting diode display of claim 11, wherein:
the common electrode includes a plurality of protruding portions, and
the second conductive portion is close to the plurality of protruding portions.

20. The organic light emitting diode display of claim 19, wherein the second conductive portion includes a second inner layer positioned at the second inner surface region of the encapsulation substrate and close to the protruding portion, a second connection layer positioned at the second side surface region of the encapsulation substrate, and a second outer layer positioned at the second outer surface region of the encapsulation substrate.

21. The organic light emitting diode display of claim 20, wherein the second inner layer has a larger area than the display unit, and includes at least one of an aluminum layer, an aluminum alloy layer, a copper layer, and a copper alloy layer.

22. The organic light emitting diode display of claim 19, further comprising a plurality of spacers under the common electrode, the plurality of protruding portions of the common electrode correspond to the plurality of spacers.

23. The organic light emitting diode display of claim 11, further comprising an insulating layer on an inner surface, a side surface, and an outer surface of the encapsulation substrate, the first conductive portion and the second conductive portion being positioned on the insulating layer.

* * * * *